United States Patent
Girani et al.

(10) Patent No.: US 11,108,358 B2
(45) Date of Patent: Aug. 31, 2021

(54) OSCILLATOR CIRCUIT ARRANGEMENT

(71) Applicant: ams AG, Premstaetten (AT)

(72) Inventors: Elisa Girani, Eindhoven (NL); Kurt Fritzenwallner, Eindhoven (NL); Bernd Janger, Eindhoven (NL)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/956,138

(22) PCT Filed: Jan. 10, 2019

(86) PCT No.: PCT/EP2019/050564
§ 371 (c)(1),
(2) Date: Jun. 19, 2020

(87) PCT Pub. No.: WO2019/141584
PCT Pub. Date: Jul. 25, 2019

(65) Prior Publication Data
US 2020/0350861 A1 Nov. 5, 2020

(30) Foreign Application Priority Data

Jan. 18, 2018 (EP) ..................... 18152314

(51) Int. Cl.
*H03B 5/36* (2006.01)
*G05F 3/26* (2006.01)
(Continued)

(52) U.S. Cl.
CPC ............ *H03B 5/364* (2013.01); *G05F 3/262* (2013.01); *H03L 7/0802* (2013.01); *H03L 7/099* (2013.01);
(Continued)

(58) Field of Classification Search
CPC ............ H03B 5/364; H03B 2200/0094; H03B 2201/031; H03L 7/0802; H03L 7/099; H03L 7/18
See application file for complete search history.

(56) References Cited

U.S. PATENT DOCUMENTS 7,369,009 B2 * 5/2008 Hofer ..................... H04L 27/12
331/116 R
9,054,637 B1 6/2015 Mittal et al.
(Continued)

FOREIGN PATENT DOCUMENTS

EP 0278079 A2 8/1988
GB 2405756 A 3/2005

OTHER PUBLICATIONS

Blanchard, Shane A., "Quick Crystal Oscillator Circuit", Proceedings of the 15th Biennial University/Government/Industry Microelectronics Symposium, 2003.
(Continued)

*Primary Examiner* — Jeffrey M Shin
(74) *Attorney, Agent, or Firm* — MH2 Technology Law Group LLP

(57) ABSTRACT

An oscillator circuit arrangement comprises a gain stage and a feedback loop that includes a crystal device. A clock signal monitor circuit is connected to an output of the gain stage and detects a frequency shift in the clock signal or a loss of oscillation. The current through the gain stage is controlled in response to a control signal generated by the clock signal monitor circuit.

18 Claims, 3 Drawing Sheets

(51) Int. Cl.
*H03L 7/08* (2006.01)
*H03L 7/099* (2006.01)
*H03L 7/18* (2006.01)

(52) U.S. Cl.
CPC ........ *H03L 7/18* (2013.01); *H03B 2200/0094* (2013.01)

(56) References Cited

U.S. PATENT DOCUMENTS

| | | |
|---|---|---|
| 2004/0135640 A1 | 7/2004 | Maneatis |
| 2008/0007351 A1 | 1/2008 | Chiu et al. |
| 2011/0227611 A1 | 9/2011 | Yeh et al. |
| 2012/0154066 A1 | 6/2012 | Kubota |
| 2015/0061786 A1 | 3/2015 | Mai |
| 2017/0272084 A1 | 9/2017 | Cho et al. |

OTHER PUBLICATIONS

Griffith, D. et al., "5.9 A 24MHz Crystal Oscillator with Robust Fast Start-Up Using Dithered Injection", 2016 IEEE International Solid-State Circuits Conference (ISSCC), San Francisco, CA, 2016, pp. 104-105.
Rohde, U.L. et al., "Electromagnetic Interference and Start-up Dynamics in High Frequency Crystal Oscillator Circuits", 2010 IEEE Sarnoff Symposium, Princeton, NJ, 2010, pp. 1-9.
Thommen, W., "An improved low power crystal oscillator", Solid-State Circuits Conference, 1999, ESSCIRC '99, the 25$^{th}$ European, IEEE, 1999; pp. 146-149.
European Patent Office, International Search Report for PCT/EP2019/050564 dated Jul. 3, 2019.

\* cited by examiner

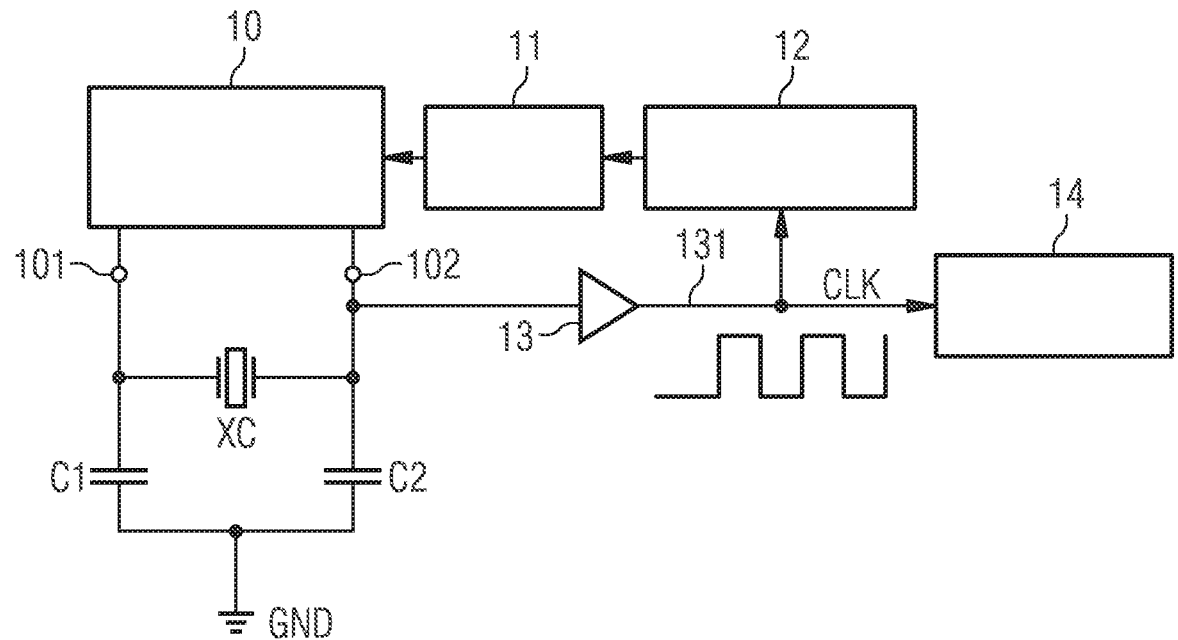
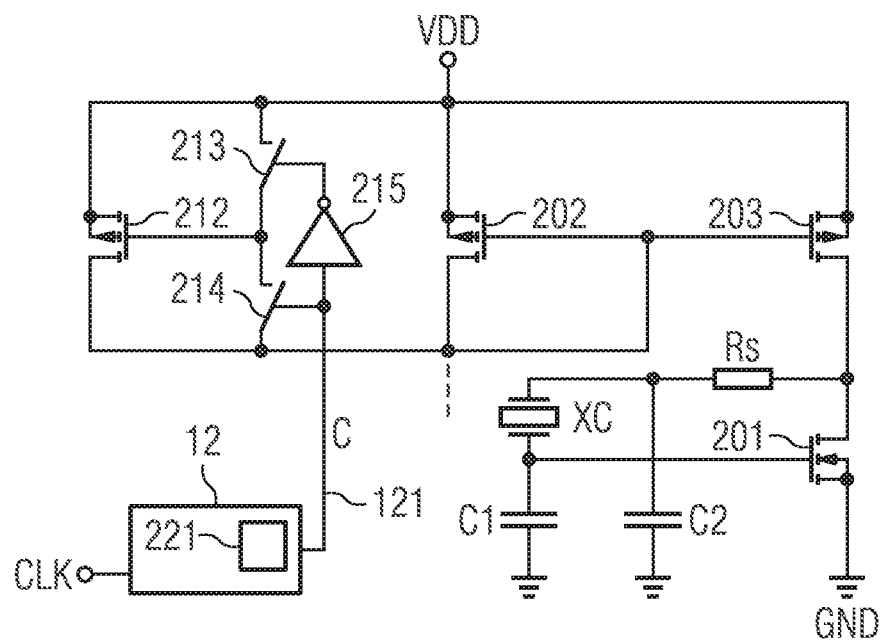

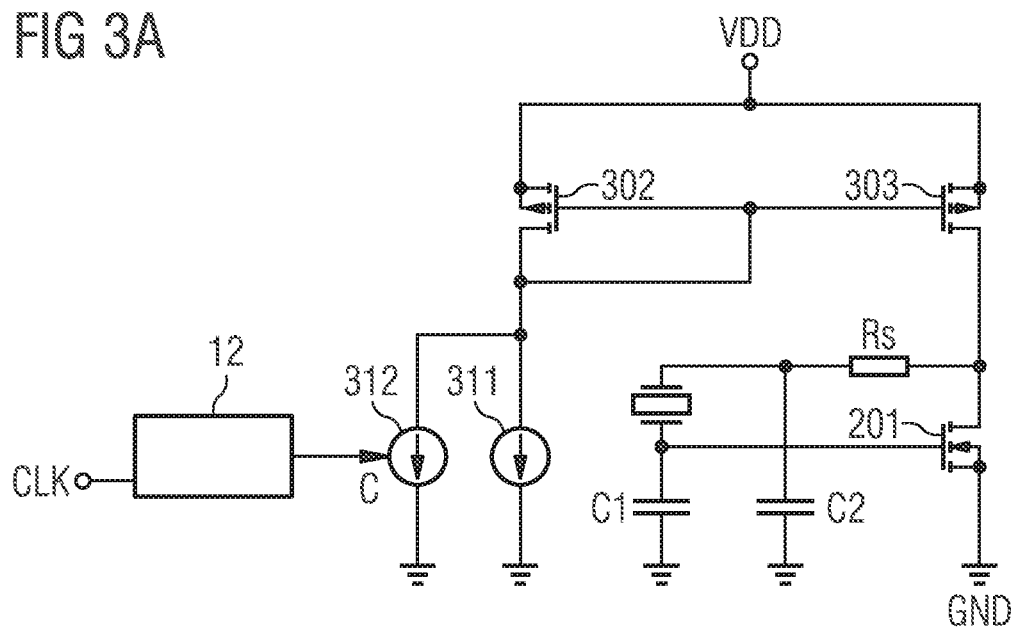
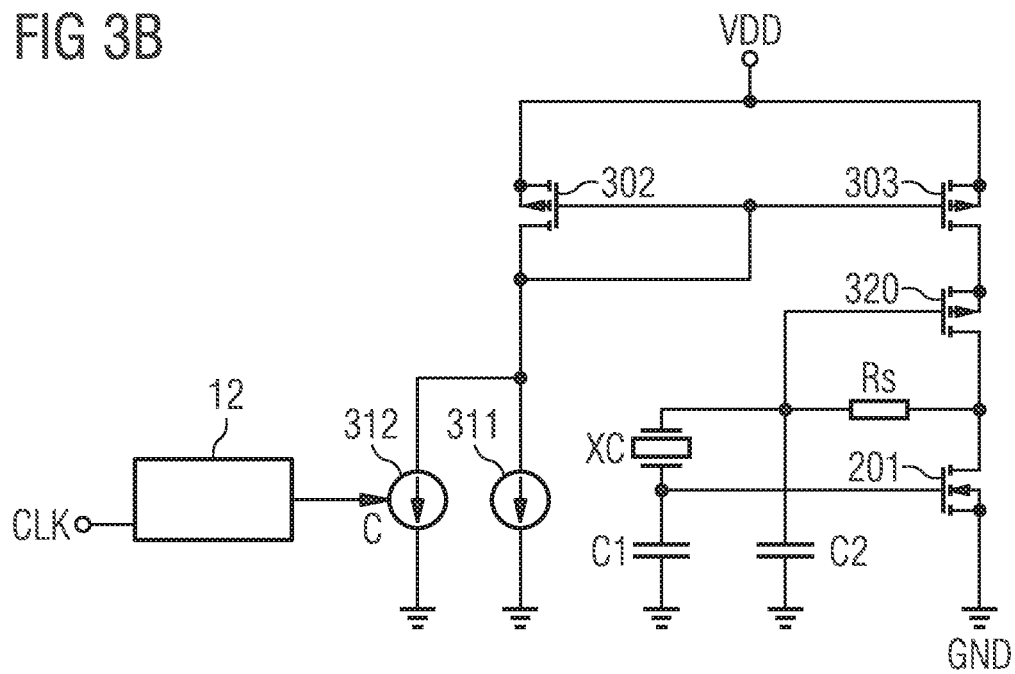

OSCILLATOR CIRCUIT ARRANGEMENT

CROSS-REFERENCE TO RELATED APPLICATIONS

The present application is the national stage entry of International Patent Application No. PCT/EP2019/050564, filed on Jan. 10, 2019, which claims benefit of priority of European Patent Application No. 18152314.3 filed on Jan. 18, 2018, all of which are hereby incorporated by reference in their entirety for all purposes.

TECHNICAL FIELD

The present disclosure relates to an oscillator circuit arrangement. Specifically, the present disclosure relates to an oscillator circuit arrangement that comprises a gain stage and a feedback loop including a crystal device connected to the gain stage. The present disclosure also relates to an electronic label that comprises such an oscillator circuit arrangement.

BACKGROUND

Oscillators are widely used to provide clock signals to control the timing of the operation of electronic devices. Oscillators may be implemented by way of an integrated circuit on a semiconductor chip with external elements such as a crystal to provide a time basis and capacitors to ensure proper phase shift of the signals.

Oscillators that are designed for low power applications may be sensitive to interferers in their bandwidth of operation that lead to a degraded performance of the oscillator such as frequency shifts in the oscillator output signal or even a complete stop of oscillation. Low frequency oscillators may require a relatively long time to restart after such an event and it may take up to several hundred Milliseconds for a low power oscillator to restart. For example, for a low power oscillator of 32 kHz oscillation frequency the recovery time may be about 100 ms. Especially in the field of electronic labels such as electronic shelf labels in supermarkets, the labels are often placed in the vicinity of other electronic systems that generate interferers by electromagnetic interference (EMI). EMI events may be generated by fluorescent lamps that are mounted on the shelf in the vicinity of the electronic labels. If the electronic label is affected by an EMI event, the display of information on the label may be disturbed or may even be lost.

There is a need to have an oscillator that is more robust against electromagnetic interference. Nevertheless, the oscillator should consume as little power as possible so that it can be used in mobile or wireless applications powered by a battery. The oscillator shall be useful for ultra-low power applications such as electronic labels and should have a short recovery time in case of an EMI event so that the display of information in the electronic label is not disturbed or lost.

SUMMARY

According to an embodiment, an oscillator circuit arrangement comprises a gain stage; a feedback loop including a crystal device connected to the gain stage; a clock signal monitor circuit detecting at least one of a frequency shift and a loss of oscillation, the clock signal monitor circuit coupled to an output terminal of the gain stage and configured to generate a control signal, the control signal controlling the current through the gain stage.

The oscillator circuit arrangement according to the present disclosure includes a clock signal monitor circuit that is coupled to the output terminal of the gain stage so that the clock signal monitor circuit operates on the digital side of the circuit arrangement. The clock signal monitor circuit monitors the presence/absence of the generated clock signal or an abnormality in the clock signal such as a frequency shift with regard to the digital clock signal. When the clock signal exhibits a frequency shift, the frequency of the clock signal varies over time. A frequency shift may also be considered as a phase shift of corresponding consecutive edges of the clock signal. Whenever this disclosure recites a frequency shift of the clock signal, this comprises also a phase shift of corresponding consecutive edges of the clock signal.

The monitoring circuit operates in the digital domain of the arrangement. During operation, the system reacts on a clock phase/frequency deviation or on the absence of the clock signal by increasing the current of the oscillator, specifically the current to the gain stage of the oscillator. The digitally working circuits for monitoring the clock signal and the current boost control loop avoid ripples in the control signal and, therefore, avoid noise in the output clock signal.

By varying the RC constant of the clock signal monitor circuit the solution can be implemented in several ways.

Firstly, the boost signal for the controllable current source can be activated only if the clock is missing, which requires the detection of a missing output clock signal by the clock signal monitor circuit. Secondly, the boost signal can be activated when the clock signal detects a change of the frequency of the clock output signal which may prevent the clock from stopping in response to a strong interferer. This requires the detection of a frequency shift in the output clock signal. Both solutions may be combined with each other. The first solution may be less complex and easier to realize, the second solution may be more accurate and faster. The present disclosure provides a solution that increases the robustness of the oscillator against interferers and EMI events with a fast clock recovery by using a digital control loop. The system reacts on clock phase/frequency deviation and/or on the absence of the clock by increasing the current supplied to the oscillator and through that the transconductance factor of the control loop.

In a boost operation for the electrical current, the control signal on the output of the clock signal monitor circuit controls a controllable current source. The controllable current source supplies the current to the gain stage of the oscillator which is increased.

In a digital circuit realization, the controllable current source is connected to an input path of a current mirror circuit. The output path of the current mirror circuit is connected to the gain stage of the oscillator and supplies the operating current to the gain stage. The current varies in response to the control signal that is dependent from the current boost state.

There are various ways to connect the controllable current source to the current mirror circuit. The current mirror circuit comprises a diode-connected MOS transistor in the input path of which the drain and gate electrodes are connected together. The output path of the current mirror includes a MOS transistor controlled by the input path of which the drain terminal is coupled to the gain stage. In one solution, the controllable current source is connected in parallel to the diode-connected MOS transistor of the input path. The controllable current source may be switched on or off in response to the control signal generated by the clock signal monitor circuit. In another solution, the controllable current source is connected in series with the diode-connected MOS transistor of the input path. The controllable current source is connected to the drain terminal of the diode-connected MOS transistor at its one end, and is connected to ground potential at its other end.

The clock signal monitor circuit may comprise a counter on its output side that avoids potential spikes in the control signal at the output of the clock signal monitor circuit. This prevents an oscillation of the control loop. The counter is in charge of keeping the control signal active for at least two periods of the clock signal so that the stability of the control loop is increased.

The clock signal monitor circuit may include a subunit to detect a frequency shift of the clock signal or the absence of the clock signal. The subunit comprises a first signal path for the clock signal and a second signal path for the inverted clock signal. Each path includes a capacitor supplied by a current source and a switch connected in parallel to the capacitor and a downstream connected Schmitt-SUBSTITUTE trigger. The outputs of the Schmitt-triggers of the first and second paths are coupled together by a gate which may be an exclusive-OR-gate (EXOR). The first and the second paths each monitor the delay between consecutive pulses in the clock signal and the length of the pulses in the clock signal, respectively.

The gain state includes at least one transistor of which input and output are connected together through the crystal device. Specifically, the gate and drain terminals of that transistor are connected to the crystal. The gain stage and the control loop are a portion of an integrated circuit, whereas the crystal device is external to the integrated circuit. In another embodiment, the transistor of the gain stage may be a portion of an inverter of which the input and output terminals are connected through the crystal device.

Because the control loop is realized in the digital domain and receives the digital output signal of the oscillator, the clock signal monitor circuit can be switched off when the oscillator output signal is in steady state. Accordingly, the solution according to the present disclosure is useful for ultra-low power applications. The current boost control loop may be activated until the output clock signal appears again in steady state so that it is used only during the clock recovery phase and switched off in steady state. The current boost control loop may be deactivated in the steady state mode. The restart can be made fast after an oscillation stop caused by external disturbers in that the additional boost current may be dimensioned sufficiently strong, although the overall circuit fulfills ultra-low power requirements when the control loop is switched off during steady state. Furthermore, the digital processing allows an estimation of time within which the crystal oscillator amplitude reaches a steady state. The digital control word that controls the current through the gain stage may be stored so that the control loop circuitry can be switched off to save power and to keep the phase noise intact.

The oscillator described in this disclosure may be used in an electronic label device. The electronic label device includes a display device on which information is displayed. The display device is clock-controlled wherein the clock signal is derived from the oscillator of the present disclosure. The display device must be refreshed after a certain amount of time, called refresh interval. Because the oscillator has a fast recovery time in the case of a detected phase/frequency shift of the clock signal or in the case of a loss of oscillation, the oscillator may recover its oscillation within the refresh interval so that it is back again in normal oscillation conditions before the next refresh operation has to take place. According to the fast recovery time, even a loss of oscillation in response to a strong EMI event will most likely not be visible on the display screen. This can be achieved with even ultra-low power consumption.

Additional features and advantages will be set forth in the detailed description which follows and in part will be readily apparent to those skilled in the art from the description or recognised by practicing the embodiments as described in the written description and claims hereof as well as the appended drawings.

The accompanying drawings are included to provide a further understanding and are incorporated in and constitute a part of the disclosure. The drawings illustrate one or more embodiments, and together with the description serve to explain principles and operation of the various embodiments. The same elements in different Figures are denoted by the same reference signs.

BRIEF DESCRIPTION OF THE DRAWINGS

In the drawings:

FIG. 1 shows a principle block diagram of an oscillator circuit arrangement according to the present disclosure;

FIG. 2 shows a detailed circuit diagram of an embodiment of an oscillator circuit arrangement;

FIGS. 3A and 3B show different versions of another embodiment of an oscillator circuit arrangement;

DETAILED DESCRIPTION OF EMBODIMENTS

Figure 4A:
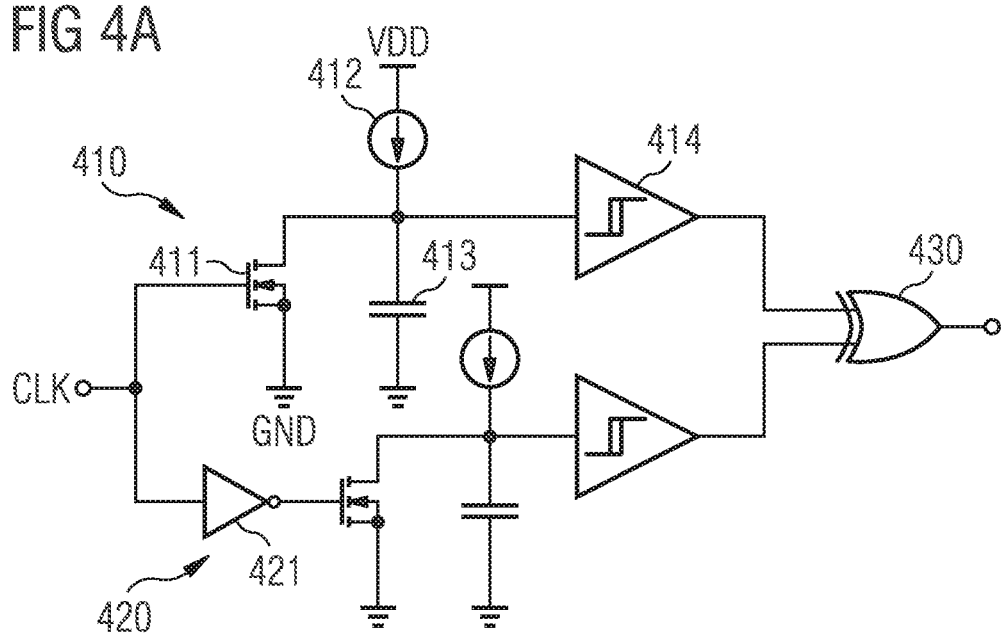
FIGS. 4A and 4B show a detailed circuit diagram of a clock monitor circuit to detect a frequency shift of the clock signal and the absence of the clock signal as well as representative signals of the circuit.

It is to be understood that both the foregoing general description and the following detailed description are merely exemplary and are intended to provide an overview or framework to understand the nature and character of the claims. The present disclosure will now be described more fully herein with reference to the accompanying drawings showing preferred embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

FIG. 1 shows a principle block diagram of an oscillator circuit arrangement according to the present disclosure. The oscillator 10 includes an amplifier or gain stage having input and output terminals 101, 102. While circuit 10 is realized in integrated form on a semiconductor chip, the terminals 101, 102 lead to the exterior of the integrated circuit. The feedback loop of the gain stage is closed with a quartz crystal device XC. The crystal is connected to respective capacitors C1, C2 that generate a phase shift for the signals so that an oscillation can take place. Capacitors C1, C2 are connected to ground potential GND. The output 102 of the gain stage is amplified through amplifier 13 to generate a full swing digital clock signal CLK at its output 131. Clock signal CLK provides a time basis for the electronic circuit 14 to control operations in the electronic circuit 14. The concept of an oscillator as shown in FIG. 1 including a gain stage, a crystal XC connected between the input and the output of the gain stage and capacitors C1, C2 connecting the crystal to ground GND is called a Pierce architecture.

The clock signal CLK is supplied to clock signal monitor circuit 12. Circuit 12 determines whether the clock signal CLK is in an abnormal state. Circuit 12 monitors whether the clock signal CLK has a frequency shift or whether the clock signal CLK is absent. Circuit 12 controls the transconductance amplification factor gm which closes the control loop in that it is fed back to the gain stage of the oscillation circuit 10.

As apparent from FIG. 1, the input signal to the clock signal monitor circuit 12 is the full swing digital signal CLK. Circuits 12 and 11 operate in the digital domain and operate as digital circuits. Accordingly, there are no ripples caused by the clock signal in the control loop so that there is no phase noise in the clock signal CLK that could have been generated by the control loop. Using digital processing in the control loop allows an estimation of time within which the crystal oscillator amplitude reaches the steady state. The final digital word that controls a current source array that realizes the gm-control can be stored, e.g., in a register so that the clock signal monitor circuit 12 or the amplitude control loop can be switched off in the steady state mode. This saves power and keeps phase noise intact.

FIG. 2 shows a detailed circuit diagram of an embodiment of an oscillator circuit arrangement according to the principles of this disclosure. The oscillator includes a gain stage in the form of an n-channel MOS transistor 201. Drain and gate of transistor 201 are coupled through quartz crystal device XC. The current through transistor 201 is supplied by a current mirror circuit 202, 203. The input path of the current mirror circuit includes diode-connected p-channel MOS transistor 202 of which gate and drain terminals are connected together. The source terminal of transistor 202 is connected to positive supply potential VDD. The output path of the current mirror circuit includes p-channel MOS transistor 203 of which the gate is connected to the gate of transistor 202. Transistor 203 supplies the operating current to the gain stage 201 of the oscillator. The current through transistor 203 is controlled by the current that flows through the input path of the current mirror circuit. The relation between input and output current of the current mirror circuit is substantially proportional. In accordance with the present disclosure, the input path of the current mirror circuit includes a controllable current source in the form of p-channel MOS transistor 212. Transistor 212 is controlled by a signal C at the output 121 of the clock signal monitor circuit 12. The signal C controls switches 213, 214 of which switch 213 may shut transistor 212 off and switch 214 may configure transistor 212 as a diode-connected transistor. The controllable current source transistor 212 is connected in parallel to transistor 202 in that transistors 202, 212 have drain and source terminals that are connected together.

Circuit 12 may detect an abnormal state of the clock signal CLK so that it enables the control signal C at its output terminal 121 which closes switch 214 and opens switch 213 so that transistor 212 is connected as a diode and is connected in parallel to transistor 202 so as to enhance the current through the input path of the current mirror circuit. Consequently, the output path transistor 203 supplies a higher current through gain stage transistor 201 so that the oscillation of the oscillator is regained and the oscillator will come back to a steady state mode. If the clock signal monitor circuit 12 determines the steady state mode in clock signal CLK, transistor 212 is shut off in that switch 214 is opened and switch 213 is closed. Furthermore, the clock signal monitor circuit 12 may also be switched off so that the control loop does not consume any power. The transistor 212 may be representative of an array of transistors which form the controllable current source. The switching state of that array of transistors, of which transistor 212 is representative, is stored in a register (not shown in the drawings) so that the clock signal monitor circuit 12 can be switched off without losing the control state of the current source array. In practise, the oscillation circuit can be designed such that it consumes a current in the range of 200 to 300 nA (Nanoampere) in the steady state mode, when the clock detecting circuitry and the corresponding control loop is switched off.

Clock signal monitor circuit 12 may include a counter 221 at the output side of circuit 12. The output of counter 221 is coupled to output 121 of clock signal monitor circuit 12. Counter 221 ensures that the control signal C is active for at least a predetermined length of time which may be at least two clock cycles of the clock signal CLK. This prevents any glitches in the clock signal 121 so that the control loop for the boost current is stable.

FIGS. 3A and 3B show other embodiments of an oscillator circuit arrangement according to the principles of this disclosure. The circuit of FIG. 3A includes a current mirror circuit 302, 303 of which the output path in the form of p-channel MOS transistor 303 is connected to the gain stage 201 and provides the operational current to gain stage transistor 201. The input path of the current mirror circuit incudes diode-connected p-channel MOS transistor 302 of which drain and gate terminals are connected together. The drain terminal of transistor 302 is connected to ground potential GND through constant current source 311. A controllable current source 312 is connected between the drain terminal of transistor 302 and ground potential GND. Controllable current source 312 is controlled by a control signal C provided at the output of clock signal monitor circuit 12. Controllable current source 312 may be realized as one n-channel transistor or as an array of several n-channel transistors that are controlled by the output signal of clock monitor circuit 12.

The oscillator circuit arrangement of FIG. 3B, in addition to the circuit of FIG. 3A, includes a p-channel MOS transistor 320 which forms the gain stage together with transistor 201. The drain source paths of transistors 201, 320 are series connected. The series connection of transistors 201, 320 is connected in series with transistor 303 of the output path of the current mirror circuit. The gate terminal of transistor 320 is coupled to the drain terminal of transistor 201 and is connected to the quartz crystal XC. An ohmic resistor Rs is connected between the output of the gain stage, which is the drain terminal of transistor 201, and the quartz crystal XC. The resistor Rs has an effect on the loop gain of the oscillator configuration.

While the circuit in FIG. 2 includes a controllable current source that is connected to the positive supply potential VDD, the circuits in FIGS. 3A and 3B include controllable current sources that are connected to ground potential GND.

Turning now to FIG. 4A, a circuit to monitor a frequency shift of the clock signal CLK and/or the absence of the clock signal CLK that may be included in clock signal monitor circuit 12 is shown. The circuit in FIG. 4A includes two paths 410, 420. Path 410 includes a capacitor 413 connected to ground potential GND that is supplied with a constant current by current source 412 from positive supply potential VDD. The drain-source path of transistor 411 is connected in parallel to capacitor 413. The gate terminal of transistor 411 is supplied with the clock signal CLK. Capacitor 413 is constantly charged by current source 412 and will be discharged through transistor 411, if a positive edge of clock signal CLK arrives. The signal on capacitor 413 is supplied to a Schmitt-trigger circuit 414 which generates an impulse in response to the charge on capacitor 413, if the signal of capacitor 413 exceeds the threshold level of the Schmitt-trigger.

The second path 420 of the circuit of FIG. 4A generates an inverted clock signal by inverter 421. The remainder of the path 420 comprises the same structure as path 410. Both paths 410, 420 are coupled to exclusive-OR-gate 430 to generate an output signal.

Figure 4B:
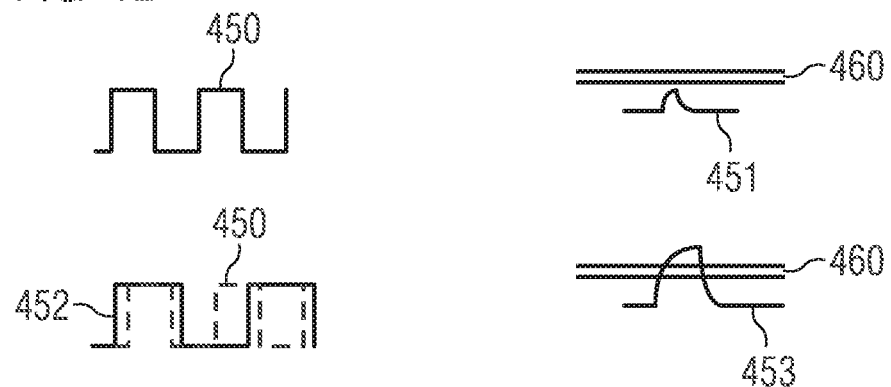

FIG. 4B shows representative signals present in path 410 to explain the frequency shift detection function of the circuit in more detail. Signal 450 represents clock signal CLK in normal operation at the nominal oscillation frequency of the oscillator. Signal 451 represents the voltage signal at capacitor 413. The falling edge of clock signal CLK shuts off transistor 411 and allows capacitor 413 to charge, while the rising edge of clock signal CLK discharges capacitor 413. When transistor 411 shuts off again with the falling edge of the clock signal, the capacitor 413 charges again. In normal operation, the voltage signal on capacitor 413 is below the threshold levels 460 of Schmitt-trigger 414 so that the output of Schmitt-trigger 414 is zero. If an interfering signal affects the oscillator, the frequency of the disturbed clock signal 452 decreases so that capacitor 413 is charged for a longer time. The voltage signal 453 of capacitor 413 exceeds the threshold levels 460 of Schmitt-trigger 414 causing a logical "1" at the output of Schmitt-trigger 414. As can be gathered from FIG. 4B, the circuit of FIG. 4A monitors the delay between the pulses of the clock signal and the length of the pulses of the clock signal by charging and discharging capacitor 413 and comparing the capacitor voltage with the Schmitt-trigger thresholds. The circuit thereby detects whether the oscillation has reached a to be detected amount of frequency deviation. The Schmitt-trigger levels 460 represent a measure for the amount of frequency deviation of the clock signal.

When an interfering signal coupled to the oscillator is so strong that oscillation will be lost, the capacitor charges up to potential VDD and remains at potential VDD which generates a logical "1" at the output of the Schmitt-trigger. In case of a loss of oscillation, the output of the oscillator may stay either at logical "0" or logical "1" so that one of paths 410, 420 will generate the logical "1" at the output of the exclusive-OR-gate 430.

Figure 5:
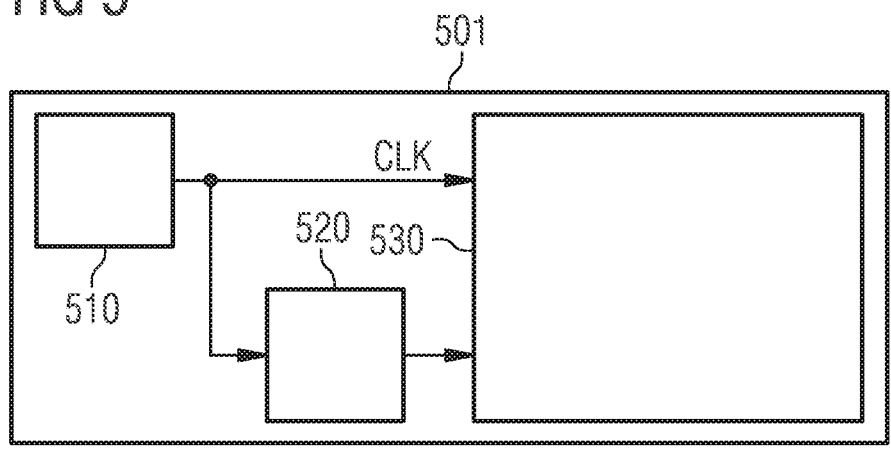
FIG. 5 shows a block diagram of an electronic label.

FIG. 5 shows the application of an oscillator circuit arrangement according to the present disclosure in an electronic device. The electronic device is an electronic label 501 such as an electronic shelf label that may be mounted to a shelve in a supermarket to display information of to be sold goods such as price information, price per quantity information, etc. The electronic shelf label 501 includes a display 530 on which the information is shown. The display 530 may be an LCD (liquid crystal display) device. Display 530 in total, or at least portions or planes thereof, is controlled in line-by-line fashion. In practise, the display may be composed of 4 planes or quadrants. The operations of display 530 are controlled in response to clock signal CLK provided by oscillator circuit arrangement 510 realized according to the principles described above. Clock signal CLK is furthermore supplied to processor 520 that generates the information to be shown on display 530.

The electronic shelf label 501 may be positioned close to other electronic devices that generate electromagnetic interference signals such as fluorescent lamps. While the electronic shelf label 501 may operate in the range of several tens of kilohertz, for example, 32 kHz, the ballast circuits of the fluorescent lamps may operate in a similar frequency range so that potential interference signals generated from them may couple into the external terminals of the oscillator 510 connected to the external quartz crystal device XC and may disturb the operation of the oscillator 510. As a result, the frequency of the clock signal CLK may deviate from its resonant frequency what can be determined by the detection of a frequency shift within the clock signal CLK. In response to an interferer, the frequency of the clock signal CLK will decrease compared to normal operation. In the worst case, the oscillator 510 may be disturbed such that the oscillation completely stops.

The clock signal monitor circuit 12 of the present disclosure determines such an event and immediately provides a boost current through the controllable current sources so that the oscillation will restart and achieve a steady state oscillation condition relatively fast. The clock signal CLK will be stable again before the next refresh operation for the display 530 or for a portion thereof becomes necessary. In practise, the refresh operation may be repeated within a refresh interval of 36 Hz. As a consequence, the information shown on display 530 will not be disturbed.

The boost current sources may be dimensioned such that a restart of the oscillation is performed as quickly as possible. Since the boost control loop is in the digital domain of the circuit, it can be switched off in the steady state mode and does not consume power in the steady state mode. The oscillator of the present disclosure is therefore useful for battery-supplied ultra-low power applications such as electronic shelf labels.

The invention claimed is:

1. An oscillator circuit arrangement, comprising:
 a gain stage;
 a feedback loop including a crystal device connected to the gain stage;
 a clock signal monitor circuit detecting at least one of a frequency shift and a loss of oscillation, the clock signal monitor circuit coupled to an output terminal of the gain stage and configured to generate a control signal, the control signal controlling a current through the gain stage;
 a current mirror circuit including an input path including a diode connected MOS transistor and an output path, the output path connected to the gain stage to supply the current to the gain stage; and
 a controllable current source connected in parallel to the diode connected MOS transistor, wherein the controllable current source is switched into one of a conductive state and a non-conductive state in response to the control signal.

2. The oscillator circuit arrangement according to claim 1, wherein the gain stage comprises an output terminal to provide a clock signal and the clock signal monitor circuit is configured to generate an increased current through the gain stage if at least one of frequency shift and loss of oscillation of the clock signal is detected.

3. The oscillator circuit arrangement according to claim 2, wherein clock signal monitor circuit is configured to be switched off when the clock signal on the output terminal of the gain stage is in a steady state mode.

4. The oscillator circuit arrangement according to claim 1, wherein the clock signal monitor circuit comprises a counter of which the output is coupled to the output of the clock signal monitor circuit to generate the output signal for at least a predetermined length of time.

5. The oscillator circuit arrangement according to claim 1, wherein the clock signal monitor circuit comprises: a first path coupled to the clock signal and a second path coupled to the inverted clock signal, the first and second paths each comprising: a capacitor supplied by a current source, a switch connected in parallel to the capacitor, a Schmitt-Trigger device connected downstream the capacitor, a gate coupling the output terminals of the Schmitt-Trigger devices of the first and second paths.

6. The oscillator circuit arrangement according to claim 1, wherein the gain stage includes at least one transistor, of which the drain terminal is coupled to the gate terminal through the crystal device, wherein the terminals of the crystal device are connected to a respective capacitor.

7. The oscillator circuit arrangement according to claim 1, wherein the controllable current source comprises a MOS transistor that is switched into a conductive state or a non-conductive state in response to the control signal.

8. The oscillator circuit arrangement according to claim 1, further comprising:
a current mirror circuit including an input path including a diode connected MOS transistor and an output path, the output path connected to the gain stage to supply current to the gain stage; and
a controllable current source connected in series with the diode connected MOS transistor, wherein the controllable current source is switched into one of a conductive state and a non-conductive state in response to the control signal.

9. The oscillator circuit arrangement according to claim 1, wherein the controllable current source is a MOS transistor, wherein switches are controlled by the control signal, wherein one of the switches is configured to shut off the MOS transistor, and wherein the other one of the switches is configured to configure the MOS transistor as a diode-connected transistor.

10. The oscillator circuit arrangement according to claim 1, wherein the controllable current source comprises a MOS transistor that is switched into a conductive state or a non-conductive state in response to the control signal.

11. An electronic label device comprising:
a display device; and
an oscillator circuit arrangement, the oscillator circuit arrangement comprising:
a gain stage;
a feedback loop including a crystal device connected to the gain stage;
a clock signal monitor circuit detecting at least one of a frequency shift and a loss of oscillation, the clock signal monitor circuit coupled to an output terminal of the gain stage and configured to generate a control signal, the control signal controlling a current through the gain stage, wherein the oscillator circuit arrangement provides a clock signal to control display of information on the display device;
a current mirror circuit including an input path including a diode connected MOS transistor and an output path, the output path connected to the gain stage to supply the current to the gain stage; and
a controllable current source connected in parallel to the diode connected MOS transistor, wherein the controllable current source is switched into one of a conductive state and a non-conductive state in response to the control signal.

12. An oscillator circuit arrangement, comprising:
a gain stage;
a feedback loop including a crystal device connected to the gain stage;
a clock signal monitor circuit detecting at least one of a frequency shift and a loss of oscillation, the clock signal monitor circuit coupled to an output terminal of the gain stage and configured to generate a control signal, the control signal controlling a current through the gain stage;
a current mirror circuit including an input path including a diode connected MOS transistor and an output path, the output path connected to the gain stage to supply the current to the gain stage; and
a controllable current source connected in series with the diode connected MOS transistor, wherein the controllable current source is switched into one of a conductive state and a non-conductive state in response to the control signal,
wherein the controllable current source is connected between the drain terminal of the diode connected MOS transistor of the current mirror circuit and the terminal for ground potential, and wherein the diode connected MOS transistor of the current mirror circuit is connected to a terminal for ground potential through a constant current source.

13. The oscillator circuit arrangement according to claim 12, wherein the gain stage comprises an output terminal to provide a clock signal and the clock signal monitor circuit is configured to generate an increased current through the gain stage if at least one of frequency shift and loss of oscillation of the clock signal is detected.

14. The oscillator circuit arrangement according to claim 13, wherein clock signal monitor circuit is configured to be switched off when the clock signal on the output terminal of the gain stage is in a steady state mode.

15. The oscillator circuit arrangement according to claim 12, wherein the clock signal monitor circuit comprises a counter of which the output is coupled to the output of the clock signal monitor circuit to generate the output signal for at least a predetermined length of time.

16. The oscillator circuit arrangement according to claim 12, wherein the clock signal monitor circuit comprises: a first path coupled to the clock signal and a second path coupled to the inverted clock signal, the first and second paths each comprising: a capacitor supplied by a current source, a switch connected in parallel to the capacitor, a Schmitt-Trigger device connected downstream the capacitor, a gate coupling the output terminals of the Schmitt-Trigger devices of the first and second paths.

17. The oscillator circuit arrangement according to claim 12, wherein the gain stage includes at least one transistor, of which the drain terminal is coupled to the gate terminal through the crystal device, wherein the terminals of the crystal device are connected to a respective capacitor.

18. The oscillator circuit arrangement according to claim 12, further comprising: a current mirror circuit including an input path including a diode connected MOS transistor and an output path, the output path connected to the gain stage to supply current to the gain stage; and a controllable current source connected in parallel to the diode connected MOS transistor, wherein the controllable current source is switched into one of a conductive state and a non-conductive state in response to the control signal.

* * * * *